United States Patent [19]

White

[11] 4,236,120
[45] Nov. 25, 1980

[54] HIGH SPEED, HIGH EFFICIENCY AMPLIFIER CIRCUIT

[75] Inventor: Charles M. White, Melbourne, Fla.

[73] Assignee: Harris Corporation, Cleveland, Ohio

[21] Appl. No.: 908,925

[22] Filed: May 24, 1978

[51] Int. Cl.³ .......................... H03F 3/04; H01J 29/70
[52] U.S. Cl. .................................. 330/296; 315/403; 330/297
[58] Field of Search ..................... 315/387, 389, 403; 330/207 P, 297, 298, 296

[56] References Cited

U.S. PATENT DOCUMENTS

| | | | |
|---|---|---|---|
| 3,526,810 | 9/1970 | Williams et al. | 330/207 P X |
| 3,546,614 | 12/1970 | Lochstampfer | 330/296 X |
| 3,577,092 | 5/1971 | Kubicz | 330/296 X |
| 3,961,280 | 6/1976 | Sampel | 330/296 X |
| 4,117,418 | 9/1978 | Höglund | 330/296 |

Primary Examiner—James B. Mullins

[57] ABSTRACT

An amplifier (10) includes several output devices (12, 14), each of which is connected to a power source providing a different supply voltage. The inputs and outputs of the devices are coupled to the same signal input ($V_{in}$) and output ($V_{out}$). The device (12) operated from the lower supply voltage generates the lower level output signals and operates at a relatively high level of efficiency. When higher level output signals are called for, the device (14) operated from the higher supply voltage becomes active. The input of the lower level device is connected to the signal input through a circuit (16) which decouples the device input from the signal input when signals are present on the signal input which would force the device into saturation. The speed of operation of the amplifier is thus enhanced, since saturation of the lower level device (12) is prevented.

6 Claims, 2 Drawing Figures

HIGH SPEED, HIGH EFFICIENCY AMPLIFIER CIRCUIT

BACKGROUND AND FIELD OF THE INVENTION

The present invention relates generally to amplifiers, and more particularly to power amplifiers employing multiple output devices which are operated from several power sources of differing supply voltages in order to increase the operating efficiency of the amplifier.

There are many applications in which it is desirable or necessary to provide an amplifier which is capable of providing high amplitude output signals. It is also desirable, of course, that such an amplifier operate as efficiently as possible. Unfortunately, these considerations are generally contradictory, since the availability of higher output signal levels generally requires that the output devices operate at higher levels of power dissipation. One manner in which these contradictory considerations have been reconciled in the past is to utilize several output devices which are connected to power sources which provide differing voltage levels. When only low amplitude output signals are called for, the lower power device provides the necessary low level output signals, and the higher power device is cut off. When higher amplitude output signals are called for, however, the low power device will be driven into saturation, and the higher power device will be called into play. This results in quite high efficiency, since the higher power device is only utilized during those transitory periods when high power is called for from the amplifier.

SUMMARY OF THE INVENTION

Although these amplifiers work quite well in providing high power output signals at relatively high efficiency levels, there use has been impeded in high frequency applications, due to the saturation of the lower power device which is caused whenever the high power device is used. Saturation of the lower power device introduces charge-storage delays which inherently limit the speed of operation of the amplifier.

The present invention avoids the problems of the prior art by decoupling the input of the low power amplifier from the signal input whenever signals are presented thereon which would force that amplifier into a saturated state. Since the low power amplifier therefore avoids saturation, it is capable of providing a higher speed of operation then in the past.

It therefore is an object of the present invention to provide a high power, high efficiency amplifier which exceeds the speed limitations of similar prior art amplifiers.

It is a further object of the present invention to provide a novel method for decoupling an amplifier input from a signal input whenever a signal is presented at the signal input which would force the amplifier into saturation.

It is yet another object of the present invention to provide a deflection yoke driver which incorporates the foregoing objects.

In accordance with the present invention, apparatus is provided which includes an amplifier having an amplifier input and an amplifier output, together with means for coupling the amplifier input to a signal input which receives a signal which is to be amplified. The coupling means includes means for causing the amplifier input to be decoupled from the signal input whenever a signal is presented at the signal input which would force the amplifier into saturation had not the decoupling occurred.

In accordance with another aspect of the present invention, apparatus is provided which includes two amplifiers, each of which is coupled between a signal input and a signal output. The first amplifier operates to amplify the signal supplied to the signal input up to a first signal level, but will saturate if forced beyond that first level. The second amplifier is operative to amplify signals beyond the first level to a second level. Means are provided for decoupling the first amplifier from the signal input when signals are presented thereto which would call for output signals beyond the first level and which would therefore force the first amplifier into saturation. The apparatus therefore provides high speed amplification of the signals since saturation of the first amplifier is substantially averted.

BRIEF DESCRIPTION OF THE DRAWINGS

The foregoing and other objects and advantages of the present invention will become more readily apparent from the following description of the preferred embodiment, as taken in conjunction with the accompanying drawings, wherein.

DETAILED DESCRIPTION

Figure 1:
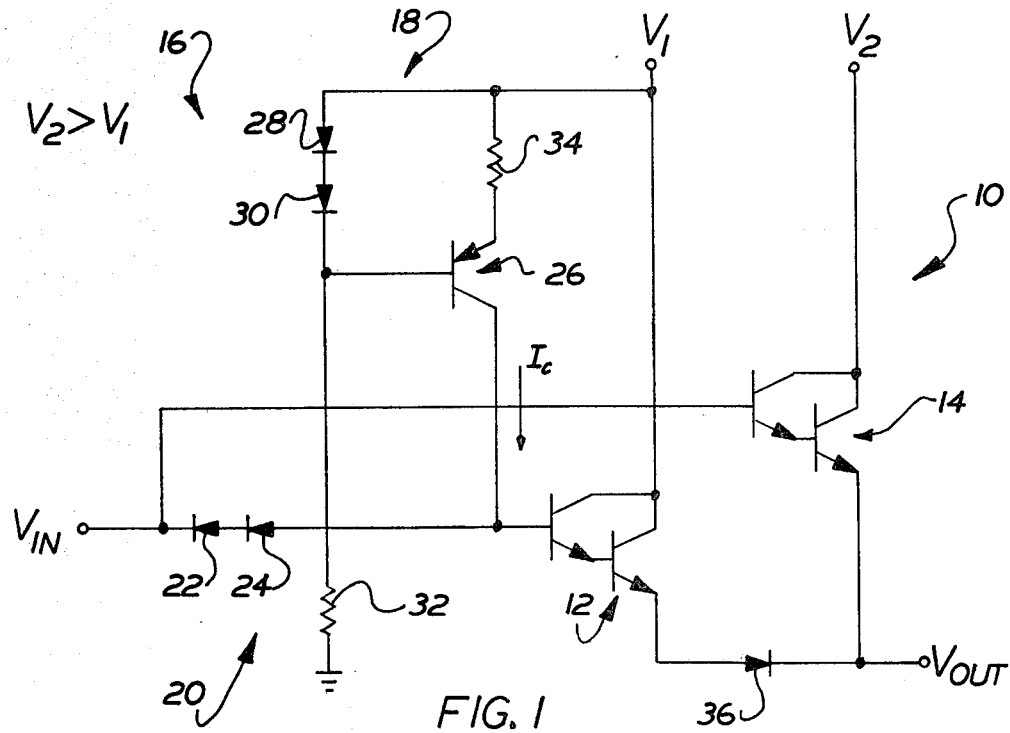
FIG. 1 is a circuit diagram of an amplifier device incorporating the present invention.

In FIG. 1 there is illustrated a power amplifier 10 including two output devices 12 and 14. These output devices, which are darlington-pair bipolar junction transistors (BJT's) in the figure, have their outputs (emitters) commonly connected to a signal output $V_{out}$ and their inputs (bases) commonly coupled to a signal input $V_{in}$. Transistor pair 12 has its collector connected to a voltage source $V_1$, and is therefore capable of providing output voltages up to, but not exceeding a voltage level of $V_1$. Transistor pair 14, however, has its collector instead connected to a voltage source $V_2$, wherein $V_2$ is greater than $V_1$. Because of this, transistor 14 is capable of providing output signals extending up to, but not exceeding the voltage level $V_2$.

As will become more apparent from the following description, transistor amplifier 12 will be in operation when low level output signals are called for, with transistor amplifier 14 being substantially cut off during the operation of transistor 12. When output signals are called for which have an amplitude which is greater than can be supplied by transistor pair 12, however, transistor pair 12 will instead be cut off, with transistor pair 14 providing the output signals above that level.

In order to prevent transistor pair 12 from saturating, a circuit, generally indicated at 16, is provided. This circuit 16 decouples the base of transistor pair 12 from the signal input $V_{in}$ whenever the input signal exceeds a certain level. This circuit 16 is comprised of a current source 18, and a current shunting circuit 20 comprised of two diodes 22 and 24.

Current source 18 includes a transistor 26 which is connected to provide a substantially fixed output current $I_C$ at collector voltages within a certain range. In order to accomplish this, the base of transistor 26 is connected to a point which is fixed at a constant voltage level. This voltage level is established by connecting two diodes 28 and 30 in series with the resistor 32 across the voltage source $V_1$ so that a constant current flows through the diodes 28 and 30 and resistor 22. By connecting the base of transistor 26 to the junction between the diodes and resistor 32, the voltage at the base of transistor 26 will also remain essentially fixed. Since the voltage across the base-emitter junction of transistor 26 is substantially constant, the voltage across emitter resistor 34 will remain constant at approximately one diode drop. The current through the collector of transistor 26 will therefore be fixed at the magnitude which will produce this voltage drop across resistor 34.

The current output $I_C$ of transistor 26 will be proportioned between two paths; the base-emitter path of transistor 12, and series connected diodes 22 and 24. If the input voltage $V_{in}$ is within the range where transistor pair 12 is active, the operation may be characterized as follows. The voltage at the collector of transistor 26 will be essentially two diode drops above the input voltage $V_{in}$. On the other hand, the collector of transistor 26 will also be three diode drops above the output voltage $V_{out}$, in view of the two diode drops associated with the base-emitter junctions of transistor pair 12 and the additional diode drop introduced by diode 36. Consequently, the voltage $V_{out}$ will be approximately one diode drop below the input voltage $V_{in}$. Since the voltage across the base-emitter junctions of transistor pair 14 must rise to approximately two diode drops in order for transistor 14 to be switched into a conductive state, transistor 14 will remain "off" as long as this condition persists (i.e., as long as transistor 12 is in operation).

As the signal level supplied to the signal input $V_{in}$ is increased in amplitude, the voltage on the collector of transistor 26 will increase correspondingly, following this change in amplitude. At some point, however, transistor 26 will become saturated, and will thus become incapable of following further increased in the input signal. The voltage at the collector of transistor 26 will thus be effectively clamped at this level, and diodes 22 and 24 will become reversed biased. This essentially decouples the signal input from the input to transistor 12.

As the voltage $V_{in}$ increases one diode drop further, however, transistor 14 will become conductive, and the voltage at the amplifier output $V_{out}$ will again follow the input signal. Since this output voltage is now greater than the voltage applied to the base of transistor pair 12, the base-emitter path of transistor pair 12 will become reverse biased. Transistor pair 12 will therefore have both its base and emitter effectively decoupled from the circuit, and transistor amplifier 14 will provide the entire amplification function.

When transistor 14 is active and transistor 12 is decoupled from the input, the voltage at the base of transistor 12 will represent the saturation voltage of current source 18. This voltage will be somewhat below the supply voltage $V_1$. Since the base of transistor pair 12 can never rise about this voltage, the collector-base junction of the first transistor of transistor pair 12 will never become forward biased, and transistor pair 12 will therefore remain out of saturation. Consequently, when the signal supplied to the input $V_{in}$ falls to a level where transistor 12 once again becomes coupled to the circuit, the delay which would have been introduced by the saturation of transistor 12 will have been eliminated. The result is an amplifier which provides high power, high efficiency, and high speed.

Transistor 26 will become saturated by this operation, however this does not represent a significant limiting constraint, since transistor 26 may be a small signal transistor having a very low storage time associated with it. Also, the stored charge resulting from saturation of transistor 26 can very rapidly be depleted by a preceding gain stage through diodes 22 and 24.

Figure 2:
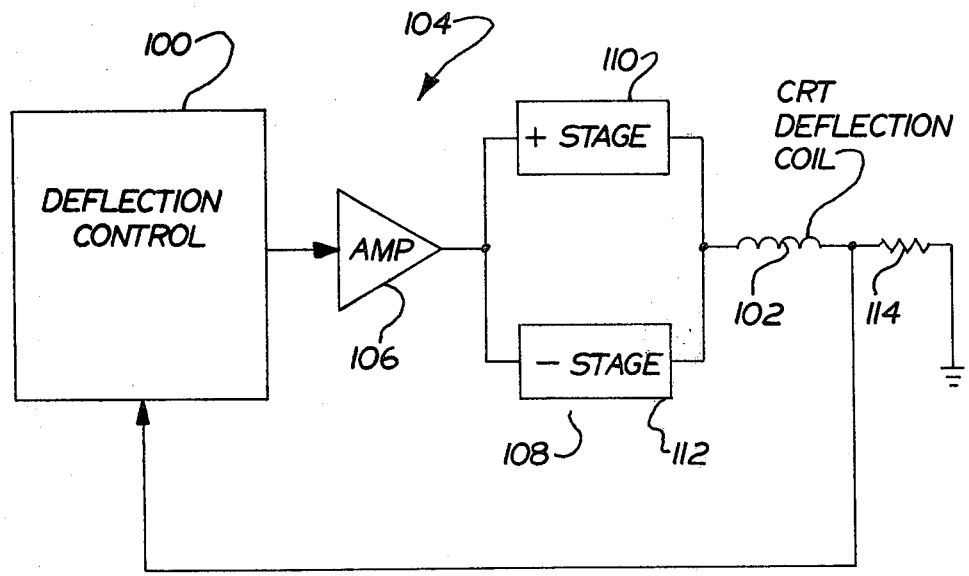
FIG. 2 is a block diagram of a CRT deflection system wherein the power amplifier of FIG. 1 may conveniently find use.

The deflection control circuit illustrated in FIG. 2 represents one of the many applications in which the amplifier of FIG. 1 could conveniently find use. This control system includes a deflection control circuit 100 which provides a signal for controlling current flow through a CRT magnetic deflection coil 102. In order to amplify the output signal of deflection control circuit 100 to usable levels, an amplifier, generally indicated at 104, is provided. Amplifier 104 includes a pre-amplifier stage 106, and a power amplifier stage 108 comprised of two amplifier stages connected in a push-pull configuration. The positive stage 110 has substantially the same form shown in FIG. 1, and operates to amplify positive voltage signals supplied thereto. The negative stage 112 also has the same general form illustrated in FIG. 1, but has the polarity of all components and voltages therein reversed. In other words, the voltages $V_1$ and $V_2$ of negative stage 112 supply negative voltages, rather than positive voltages, with $V_2$ still having magnitude which is greater than $V_1$. In addition, all of the diodes 22, 24, 28, 30, and 36 are reversed in the circuit (i.e., the anode and cathode connections thereof are interchanged). Furthermore, PNP transistors are substituted in place of NPN transistor pairs 12 and 14 of FIG. 1, whereas an NPN transistor is substituted for the PNP transistor 26 of FIG. 1. The base, emitter, and collector connections of all the transistors are the same as in FIG. 1, however. The resulting negaive stage operates to amplify negative voltages supplied thereto in a manner completely analogous to the manner of operation of the positive stage illustrated in FIG. 1. These two stages 110 and 112 are connected in parallel so that the output of pre-amplifier stage 106 is commonly directed to both stages, whereas the outputs of the two stages are commonly connected to the CRT deflection coil 102.

A small resistor 114 is included in series with the CRT deflection coil 102 to develop a voltage which is proportional to the magnitude of the current flowing through CRT deflection coil 102. This voltage signal is supplied to deflection control circuit 100 for control purposes.

Whenever a rapid change in the magnitude of the current flowing through CRT deflection coil 102 is desired, deflection control circuit 100 will institute an abrupt and major change in the amplitude of the voltage signal being supplied to amplifier 106. This will result in a corresponding change in the magnitude of the voltage supplied by either stage 110 and 112, whichever is active at the particular moment. After some delay introduced by the inductive nature of coil 102, the current signal through CRT deflection coil 102 will increase to the point where the voltage signal applied by current sensing resistor 114 indicates that the appropriate current level has been reached. At this point, the deflection control circuit will modify the control signal being supplied to amplifiers 104 so as to maintain the current level at that magnitude.

The amplifier illustrated in FIG. 1 has particular advantages when employed in the system of FIG. 2, or when utilized in a push-pull configuration of any type. Since the low power transistor pair 12 will never saturate, the transistor may be switched rapidly between conductive and non-conductive states. The amount of cross-conduction between the positive and negative stages of the push-pull amplifier is therefore minimized. In addition, of course, the high speed nature of the amplifier will be advantageous in providing rapid and accurate changes in the magnitude of the current flowing through CRT deflection coil 102, and thus in the position of the electron beam on the face of the CRT (not shown).

Although the invention has been described with respect to a preferred embodiment, it will be appreciated that various rearrangements and alterations of parts may be made without departing from the spirit and scope of the present invention, as defined in the appended claims.

What is claimed is:

1. Apparatus comprising an amplifier having an amplifier input and an amplifier output, means for coupling said amplifier input to a signal input for receiving a signal to be amplified therefrom, said coupling means including means for decoupling said amplifier input from said signal input whenever a signal is supplied to said signal input which would force said amplifier into saturation, but for said decoupling, wherein said amplifier comprises a current amplifier, and wherein said decoupling means comprises fixed current means for providing a substantially fixed level of current flow through a connection point, means for connecting said connection point to said amplifier input, and unidirectional current shunting means connected between said signal input and said amplifier input, said current shunting means being poled to shunt current away from said amplifier input to an extent which is dependent upon the amplitude of the signal supplied to said signal input.

2. Apparatus comprising:
a first amplifier having an input and output, and operated from a power source which provides power at a first voltage level,
a second amplifier having an input and an output, and operated from a power source which provides power at a second voltage level which is greater in magnitude than said first voltage level, and
means for coupling each of said inputs of said first and second amplifiers to a common signal input and for coupling each of said outputs of said first and second amplifiers to a common signal output, said coupling means including means for decoupling said input of said first amplifier from said common signal input whenever a signal is supplied to said common signal input which would force said first amplifier into saturation but for said decoupling, wherein said first amplifier comprises a current amplifier, and wherein said decoupling means comprises fixed current means for providing a substantially fixed level of current flow through a connection point, means for connecting said connection point to said first amplifier input, and unidirectional current shunting means connected between said signal input and said first amplifier input, said current shunting means being poled to shunt current away from said first amplifier input to an extent which is dependent upon the amplitude of the signal supplied to said signal input.

3. Apparatus comprising first and second current amplifiers, each of which is coupled between a signal input and a signal output, said first amplifier being operative to amplify signal supplied to said signal input up to a first level but which will saturate if signals are presented thereto for amplification which would call for output signals beyond said first level, and said second amplifier being operative to amplify signals beyond said first level to a second level, and means for decoupling said first amplifier from said signal input when said signals are presented thereto which would call for output signals beyond said first level and thus force said first amplifier into saturation but for said decoupling, said decoupling means comprising fixed current means for providing a substantially fixed level of current flow through a connection point, means for connecting said connection point to said first amplifier input, and unidirectional current shunting means connected between said signal input and said first amplifier input, said current shunting means being poled to shunt current away from said first amplifier input to an extent which is dependent upon the amplitude of the signal supplied to said signal input, whereby said apparatus provides high speed amplification of signals since saturation of said first amplifier is substantially averted.

4. Apparatus as set forth in claims 2 or 3, wherein said unidirectional current shunting means comprises at least one diode.

5. Apparatus as set forth in claims 2 or 3, wherein said fixed current means operates, when said signals are present at said signal input which would force said first amplifier into saturation, to clamp said input of said first amplifier to a voltage which will not produce saturation of said first amplifier, whereby said unidirectional current shunting means will then be biased so that substantially no current flows therethrough and said first amplifier input is therefore effectively decoupled from said signal input.

6. Apparatus as set forth in claim 3, wherein said second amplifier comprises amplifier means which remains in a cutoff condition until the voltage difference between said signal input and said signal output exceeds a predetermined amount, said voltage level exceeding said predetermined amount only when said first amplifier is decoupled from said signal input.

* * * * *